United States Patent [19]

Thillays et al.

[11] Patent Number: 4,742,432
[45] Date of Patent: May 3, 1988

[54] MATRIX OF LIGHT-EMITTING ELEMENTS AND METHOD OF MANUFACTURING SAME

[75] Inventors: Jacques C. Thillays, Herouville; André Talpied, Ifs, both of France

[73] Assignee: U.S. Philips Corporation, New York, N.Y.

[21] Appl. No.: 799,528

[22] Filed: Nov. 19, 1985

[30] Foreign Application Priority Data

Dec. 7, 1984 [FR] France ................................ 84 18731

[51] Int. Cl.$^4$ ................................................ H05K 7/08
[52] U.S. Cl. ........................................ 361/400; 29/837; 29/842; 340/719; 362/800; 313/500
[58] Field of Search ................. 362/800; 361/400, 403, 361/406, 410; 313/499, 500, 501; 340/718, 719; 357/75; 29/832, 837, 842, 844, 845

[56] References Cited

U.S. PATENT DOCUMENTS

| | | | |
|---|---|---|---|
| 3,512,027 | 5/1970 | Kupsky | 313/499 |
| 4,159,648 | 7/1979 | Prosky | 361/400 X |
| 4,271,408 | 6/1981 | Teshima et al. | 340/702 |
| 4,336,580 | 6/1982 | Mouyard et al. | 362/347 |

Primary Examiner—A. D. Pellinen
Assistant Examiner—H. L. Williams
Attorney, Agent, or Firm—Algy Tamoshunas; Brian J. Wieghaus

[57] ABSTRACT

An electrically insulating substrate has an array of holes formed in it for accepting electrically conducting support pins, each pin having a light-emitting element mounted on the upper pin end. Each upper pin end is surrounded by an insulating ring and a conducting ring, the light emitting element being connected electrically between the conducting pin and the conducting ring. Electrical connections are made via a printed wiring pattern on each surface of the substrate. Optical collimating elements are formed in a wafer having openings that surround each of the conducting rings with a small clearance, the wafer engaging and being insulated from the substrate with the printed wiring.

2 Claims, 1 Drawing Sheet

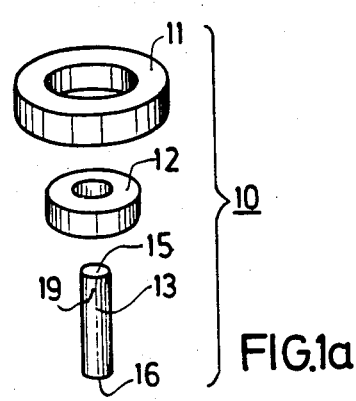
FIG.1a
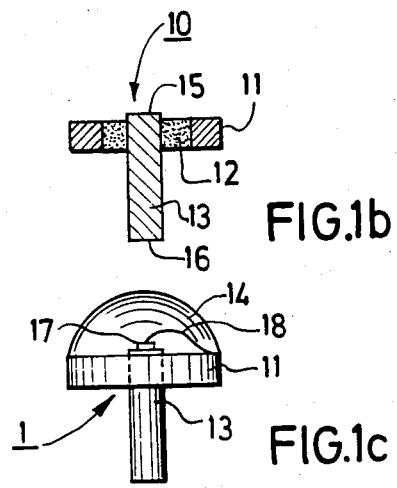
FIG.1b
FIG.1c
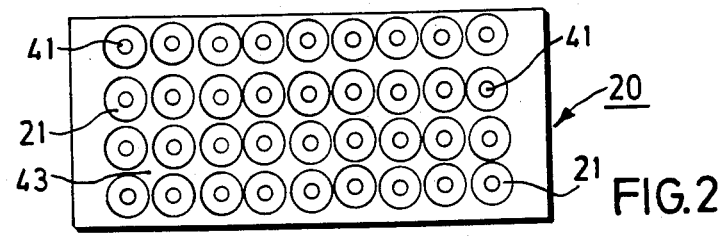
FIG.2
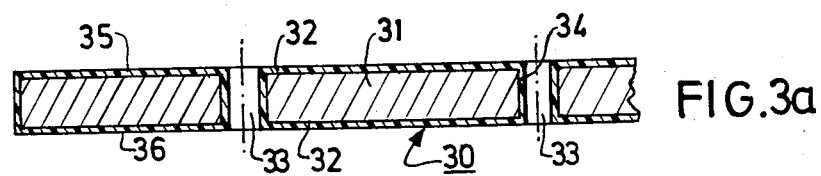
FIG.3a
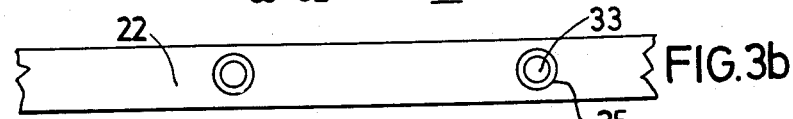
FIG.3b
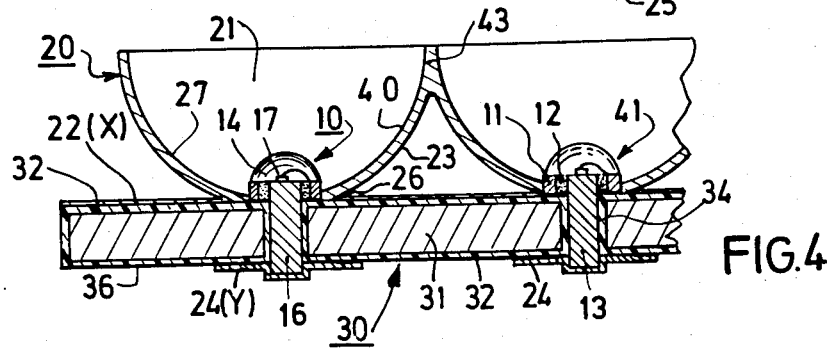
FIG.4

MATRIX OF LIGHT-EMITTING ELEMENTS AND METHOD OF MANUFACTURING SAME

The invention relates to a matrix of light-emitting elements mounted on an insulating substrate having conductor tracks for electrically interconnecting them and each arranged in the focus of an optical collimation element, at least several of the said elements being provided in at least one wafer, whose lower surface covers the upper surface of the substrate, and being prolonged by cylindrical openings merging at the lower surface of the wafer.

Such a matrix is known from U.S. Pat. No. 4,254,453, in which the light-emitting elements are diodes in an envelope of a conventional type and having collimation elements constituted by parabolic reflecting cavities. The diodes are mechanically held by an insertion plate serving as a substrate. A one- or double-sided printed circuit card is used to establish the electrical connections.

This matrix has the disadvantage of a large number of elements and of a comparatively complicated mounting process because it requires operations of precisely aligning the printed circuit and the plate forming a substrate, of orientating beforehand the anode and the cathode of the light-emitting elements and of inserting the latter each into two aligned holes of the plate forming a substrate and of the printed circuit in such manner that their electrical outputs move towards the outside, of soldering the electrical outputs of the diodes on the printed circuit and of positioning the wafer carrying the parabolic cavities in such a manner that the diodes are held in engagement therewith due to the elasticity of their electrical outputs moved to the outside.

According to the invention, the matrix is simpler than that according to the prior art mentioned above because it has neither a special wafer forming a printed circuit board nor a panel for elastically holding the wafer carrying the optical collimation elements.

For this purpose, it is characterized in that each element comprises on the one hand a support constituted by an electrically conducting pin having an upper surface and a lower surface, by an insulating ring surrounding a lateral upper part of the conducting pin and by a conducting ring surrounding the insulating ring and on the other hand a light-emitting component mounted on the upper surface of the conducting pin in such a manner that it forms an electrical contact with the latter, in that the conducting pin traverses a hole of the substrate in such a manner that its lower surface is in electrical contact with conductor tracks of the lower surface of the substrate, in that the conducting ring is electrically connected on the one hand to the light-emitting component and on the other hand to conducting tracks of the upper surface of the substrate, and in that at least the lower surface and the cylindrical openings of the wafer are insulating, the said cylindrical openings engaging each other with a small amount of clearance in the conducting rings.

Thus, the substrate carries directly on its two surfaces the conductor tracks, which at the same time serve to hold in place the light-emitting elements, while the wafer gets into contact with the substrate and is held in place with a small amount of clearance by cooperation between the cylindrical openings forming a prolongation of the optical collimation elements and the corresponding conducting rings.

The optical collimation elements can be chosen among the parabolic reflecting cavities, such as those described in U.S. Pat. No. 4,254,453 mentioned above, or the light ducts of the type described, for example, in German Patent Application DE A 2,201,574, or in European Patent Application EP 117,606.

According to a preferred embodiment, the conductor tracks of at least one surface of the substrate are applied by silk screen printing. It is then advantageous that the lower surface of the conducting pins projects slightly beyond the corresponding hole of the substrate. The electrical connection of the elements of the matrix is generally such that the conductor tracks of the substrate connect the light-emitting elements according to lines on a surface of the substrate and according to columns on the other surface of the latter.

The light-emitting components can be enveloped by a protective dome of transparent material adapting the optical indices between the said components and air.

The substrate may advantageously consist of a thermally good conducting material, for example aluminium coated with an anodic oxidation layer. The heat dissipated by the diodes being transported to the substrate mainly through the conducting pins, a satisfactory thermal evacuation is obtained.

The method according to the invention can also be effected more readily than that according to the aforementioned prior art.

The insertion step simply consists in that the conducting pins are introduced into the corresponding holes of the substrate without it being necessary to orientate them angularly, while the elements are held in place by uniting them with the conductor tracks of the substrate. Positioning of the wafer carrying the optical collimation elements is also simplified by the fact that the latter is positioned by the cooperation with a small amount of clearance between the cylindrical parts of the wafer and the conducting rings and by its engagement with the substrate.

The method according to the invention has for its object to manufacture a matrix of the kind defined above and for this purpose comprises the following steps:

(a) forming the conductor tracks according to a desired geometry at least on one upper surface of an insulating insulating substrate provided with holes adapted to receive the said elements;

(b) inserting into the holes at least the supports of the elements, the latter comprising an electrically conducting pin having an upper surface and a lower surface, an insulating ring surrounding a lateral upper part of the conducting pin and a conducting ring surrounding the insulating ring, the desired geometry of the conductor tracks being such that the latter get into electrical contact with the corresponding conducting rings;

(c) uniting the conducting rings with the corresponding conductor tracks of the upper surface of the substrate;

(d) forming conductor tracks according to a desired geometry on the lower surface of the substrate in such a manner that the latter gets into electrical contact with the lower surface of the conducting pin;

(e) uniting the conducting pin with the corresponding conductor tracks of the lower surface of the substrate;

(f) providing on the substrate at least one wafer having a plurality of optical collimation elements being prolonged by cylindrical insulating openings engaging the conducting rings with a small amount of clearance until the insulating lower surface of the wafer engages the substrate.

According to a preferred embodiment, the conductor tracks of at least one surface of the substrate are formed by silk screen printing, the said uniting step being effected by sintering the tracks obtained by silk screen printing.

The structure of the matrix permits of mounting the light-emitting components on the upper surface of the conducting pins either before the insertion of the supports into the holes of the insulating substrate, that is to say that complete light-emitting elements are inserted, or after the said insertion of the supports, that is to say that the elements are collectively completed on the matrix itself after any one of the steps c to f. The light-emitting component can be enveloped by a protective dome of transparent material at the same time serving as an index adapter.

In order that the invention may be readily carried out, it will now be described more fully, by way of example, with reference to the accompanying drawing, in which:

FIGS. 1a to 1c show a support before mounting, a support after mounting and a pre-assembled light-emitting element, respectively;

FIG. 2 is a plan view of a wafer carrying the parabolic cavities;

FIG. 3a is a sectional view of an insulating substrate according to the invention;

FIG. 3b shows a detail of a metallization of the upper surface of the said substrate; and FIG. 4 shows in sectional view a detail of a matrix according to the invention.

According to FIG. 1a, a support 10 is constituted by a conducting cylindrical pin 13, generally of metal, having an upper surface 15 and a lower surface 16, by an insulating ring 12 of glass or of thermoplastic material, whose internal diameter corresponds to that of the pin, and by a conducting ring 11, whose internal diameter corresponds to the external diameter of the insulating ring 12.

According to FIG. 1b, these three elements are mounted in such a manner that the ring 12 is mounted on the lateral upper part 19 of the pin 13 and that the disks 11 and 12 are situated in the same plane and that the upper surface 15 of the conducting pin 13 slightly projects. The process of uniting the pin with the two rings is faciliated either by a glass-metal solder when the ring 12 is made of glass, or by a simple heating in the case in which it is made of thermoplastic material.

According to FIG. 1c, a light-emitting component 17, for example a diode, is glued by means of a conducting glue to the upper surface 15 of the conducting pin 13. The optical coupling can be improved due to a dome of transparent resin 14 permitting an index adaptation between the component 17 and air. This dome 14 also covers the rings 12 and 11, which improves the mechanical stability of the support 10. The anode of the diode 17 is electrically connected to the conducting ring 11 by a soldered wire 18.

According to FIGS. 2 to 4, the matrix comprises an insulating substrate 30 having holes 21 arranged in lines and columns for forming the network of the matrix. The substrate 30 is made in this case of aluminium 31 coated with an anodization layer covering at 32 its upper and lower surfaces 35 and 36, respectively, and at 34 the edges of the holes 33.

In the finished matrix (FIG. 4), the conducting pins 13 are arranged with a small amount of clearance in the holes 33 and the rings 11 and 12 engage metallizations 22 (axis X) situated on the upper surface 35 of the substrate 30. The lower surfaces 16 of the pins 13 get into contact with metallizations 24 of the lower surface 36 of the substrate 30. The metallizations 22, obtained preferably by silk screen printing, are arranged in lines and the metallizations 24 (axis Y), obtained preferably by silk screen printing, are arranged in columns so that the conventional interconnection in the matrices is obtained. The lower part 16 of the pins 13 advantageously projects beyond the lower surface 36 of the substrate 30 and is covered by the metallization 24 obtained by silk screen printing, which improves the mechanical and electrical connection thereof. The axis of the metallizations 22 crosses that of the corresponding holes 33. At the level of the latter, the metallizations 22 are interrupted along a circle 25 having a diameter approximately equal to the internal diameter of the rings 11.

A wafer 20 has parabolic cavities 21, which are prolonged to the lower surface 23 of the said wafer by circular openings 41, whose external diameter corresponds but for a small amount of clearance to the external diameter of the conducting rings 11. The openings 41 are arranged according to the same network as the elements 1. The wafer 20 is arranged so that it engages the upper surface 35 of the substrate 30. More particularly, each cavity 21 is constituted by a half-shell 40 having comparatively thin walls, the shells being integral with each other at their periphery in the regions 43. The lower surface 23 of the half-shells 40 has a central region 26 surrounding the openings 41 and engaging the upper surface 35 of the substrate 30.

The said wafer 20 may consist of moulded plastic material and may be metallized on the lower surface 27 of the half-shells.

At any rate, the central regions 26 and the openings 41 have to remain insulating.

By way of variation, the wafer 20 comprises at least one light duct as described in the Applications DE A 2,201,574 or EP A 117,606 mentioned above. Such a duct has a hemispherical cavity and it suffices that this cavity is prolonged by a cylindrical part cooperating with a small amount of clearance with the corresponding conducting ring 11.

The matrix is mounted in the following manner:

The supports 10, on which the components 17 are or are not mounted, are introduced into the holes 33 of the substrate 30. Subsequently, the metallizations 22 and the conducting rings 11 are united. If the metallizations 22 are obtained by silk screen printing, if suffices to sinter the tracks formed by silk screen printing. For metallizations of the printed circuit type, it suffices to provide soldering areas on an automatic station.

The metallizations 24 are then formed on the lower surface 36 of the substrate 30. It is preferable to carry out this operation by returning the substrate 30. The preferred solution is the silk screen printing process, which permits by a subsequent sintering step of terminating the electrical and mechanical positioning of the supports. It is advantageous when the lower surface 16 of the pins 13 projects beyond the lower surface 36 of the substrate 30.

Any steps of positioning components 17 and of enveloping by domes 14 may be effected at any instant, but it will be most suitable to do so after the steps of sintering of the tracks obtained by silk screen printing.

The process of assembling the matrix is terminated by arranging the wafer(s) 20 carrying the parabolic cavities 21. It is to be noted that the shape of half-shells 40 having thin walls facilitates due to its slight elasticity to a certain extent the introduction of the openings 41 into the rings 11.

The invention is not limited to the embodiments described and shown. Thus, series connections between diodes of the matrix may be obtained by means of suitable connections to a connector into which the substrate is plugged, or by means of a wholly conducting part having the same shape as the supports 10 and disposed in a hole 33 chosen in a suitable manner.

What is claimed is:

1. A light-emitting matrix comprising:
    a thermally conductive generally planar substrate having an upper surface, a lower surface, and an array of holes therethrough, at least said surfaces and inner surfaces of said holes being electrically insulating,
    a plurality of thermally and electrically conducting supports disposed in respective holes, each support having an upper end extending above said upper surface, and a lower end extending downwardly at least to said lower surface,
    a plurality of lower electrically conducting tracks formed on said lower surface in a pattern, each support having at least a portion of the lower end covered by and electrically connected to a selected one of said lower tracks,
    a plurality of insulating rings, each ring disposed around a respective upper end of a support and having a lower ring surface engaging said upper insulating surface,
    a plurality of conducting rings, each ring disposed around a respective insulating ring,
    a plurality of upper electrically conducting tracks formed on said upper surface in a pattern, each conducting ring being electrically connected to a selected one of said upper tracks,
    a plurality of light-emitting elements, each element being disposed on and having an electrical connection to an upper end surface of a respective support, and each element having an electrical connection to the respective conducting ring disposed around said respective support, and
    a wafer having an insulating lower surface engaging said substrate and having a corresponding array of openings formed therein, each opening surrounding a respective conducting ring with a small clearance; said wafer having a corresponding array of optical collimation elements formed therein communicating with the openings in the wafer, arranged such that each collimation element has a focus located at the light-emitting element disposed on the support which is within the respective opening.

2. A method of manufacturing a matrix of light-emitting elements, characterized by comprising:
    (a) providing a thermally conducting substrate having an array of holes therethrough, and at least electrically insulating upper and lower surfaces and inner surfaces of said holes,
    (b) forming conductor tracks according to a desired geometry at least on said upper surface,
    (c) providing a plurality of supports each comprising an electrically conducting pin having an upper surface and a lower surface, and inserting said supports into respective holes with said support upper surfaces extending above said substrate upper surface,
    (d) providing an insulating ring, and a conducting ring surrounding the insulating ring, around an upper extending portion of each conducting pin, with the conducting ring in electrical contact with at least one selected conductor track,
    (e) uniting said conducting rings with the respective conductor tracks on the upper surface of the substrate,
    (f) forming conductor tracks according to a desired pattern on the substrate lower surface, with each support pin lower surface being in electrical contact with at least one conductor back on the lower surface,
    (g) uniting the conducting pins with the corresponding tracks on the substrate lower surface, and
    (h) providing a wafer having an insulated lower surface, an array of cylindrical insulating openings, and an array of optical collimation elements respectively communicating with openings in the wafer, and securing the wafer to the substrate with the insulating lower surface of the wafer engaging the substrate and the openings in the wafer surrounding respective conducting rings with a small clearance.

* * * * *